United States Patent
Doyle

(10) Patent No.: US 7,308,661 B2
(45) Date of Patent: Dec. 11, 2007

(54) METHOD AND APPARATUS FOR CHARACTERISTIC IMPEDANCE DISCONTINUITY REDUCTION IN HIGH-SPEED FLEXIBLE CIRCUIT APPLICATIONS

(75) Inventor: Matthew Stephen Doyle, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 462 days.

(21) Appl. No.: 11/008,812

(22) Filed: Dec. 9, 2004

(65) Prior Publication Data

US 2006/0129965 A1   Jun. 15, 2006

(51) Int. Cl.
*G06F 17/50* (2006.01)

(52) U.S. Cl. ............................................. 716/5; 716/10

(58) Field of Classification Search ................ None
See application file for complete search history.

(56) References Cited

U.S. PATENT DOCUMENTS

| | | | |
|---|---|---|---|
| 6,532,439 B2* | 3/2003 | Anderson et al. | 703/14 |
| 6,845,492 B1* | 1/2005 | Frank et al. | 716/2 |
| 2005/0246669 A1* | 11/2005 | Yamazaki | 716/5 |

\* cited by examiner

*Primary Examiner*—Leigh M. Garbowski
(74) *Attorney, Agent, or Firm*—Joan Pennington

(57) ABSTRACT

A method and apparatus are provided for implementing characteristic impedance discontinuity reduction in customized high-speed flexible circuit applications. A curved artwork region is selected and selected cells are scanned. An area on opposite sides of a signal wire within each cell is determined. The identified areas are compared using a user defined delta value. If the compared areas differ greater than the user defined delta value, then a coordinate change is computed for moving the signal wire to reduce characteristic impedance discontinuity.

6 Claims, 8 Drawing Sheets

PRIOR ART

PRIOR ART

METHOD AND APPARATUS FOR CHARACTERISTIC IMPEDANCE DISCONTINUITY REDUCTION IN HIGH-SPEED FLEXIBLE CIRCUIT APPLICATIONS

FIELD OF THE INVENTION

The present invention relates generally to the data processing field, and more particularly, relates to a method and apparatus for implementing characteristic impedance discontinuity reduction in customized high-speed flexible circuit applications.

DESCRIPTION OF THE RELATED ART

Flexible circuits or flex circuits are used in various electronic packages and circuit applications. One significant contribution of flexible circuits is their ability to meet stringent mechanical flexibility requirements.

Flex circuits are generally applied to all static and dynamic interconnects that cannot be accomplished through rigid card constructs. Through the use of flexible dielectric and bonding mediums, combined with mesh reference planes, flex circuits can provide dynamic, high-speed interconnects.

To further improve mechanical flexibility, flex circuit wiring may utilize wiring radii generally including curves, arcs, and the like, instead of 45-degree segments common to rigid card designs. However, signal-to-reference plane orientation along these curved paths provides opportunity for high-frequency impedance variation, as varying amounts of shield copper are referenced through the physical artwork bend area. Solid shields would eliminate this condition, yet they would also inhibit the achievement of flexibility requirements.

Good flex circuit design requires that the mesh reference layers are oriented at 45 degrees with respect to the signal layers. However, in areas of curved artwork wiring, within mediums utilizing mesh reference planes, it is not possible to maintain a 45-degree signal-to-reference orientation. FIG. 1A illustrates X-ray data of an area of curved artwork in a prior art flexible circuit. FIG. 1B provides an enlarged detail of a curved artwork in a prior art flexible circuit. This X-RAY data of an actual product displays the reality that in curved wiring areas inconsistent referencing can be expected. FIG. 2 illustrates prior art characteristic impedance variations with respect to multiple signal lines across a curved artwork area, for example, of the prior art flexible circuit of FIGS. 1A and 1B.

Characteristic impedance discontinuity problems arise in flexible mediums when signal lines traverse artwork radii. The problem is specific to these curved wiring regions in high-speed designs. There are no known current methods to addressing this problem.

A need exists for an effective mechanism for implementing characteristic impedance discontinuity reduction in customized high-speed flexible circuit applications

SUMMARY OF THE INVENTION

A principal aspect of the present invention is to provide method and apparatus for implementing characteristic impedance discontinuity reduction in customized high-speed flexible circuit applications. Other important aspects of the present invention are to provide such method and apparatus for implementing characteristic impedance discontinuity reduction in customized high-speed flexible circuit applications substantially without negative effect and that overcome many of the disadvantages of prior art arrangements.

In brief, a method and apparatus are provided for implementing characteristic impedance discontinuity reduction in customized high-speed flexible circuit applications. A curved artwork region is selected and selected cells are scanned. An area on opposite sides of a signal wire within each cell is determined. The identified areas are compared using a user defined delta value. If the compared areas differ greater than the user defined delta value, then a coordinate change is computed for moving the signal wire to reduce characteristic impedance discontinuity.

In accordance with features of the invention, an alternative method is provided for implementing characteristic impedance discontinuity reduction in customized high-speed flexible circuit applications. Selected cells within the curved artwork region are scanned and a physical geometry of a signal wire and mesh reference lines within each cell are determined. A characteristic impedance value is calculated for the selected cells. The characteristic impedance value for the cells is compared using a user defined threshold value. Responsive to a difference of the compared values being greater than the user defined threshold value, an incremental coordinate change is provided for the signal wire for moving the signal wire to reduce characteristic impedance discontinuity.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the preferred embodiments, an automated process is provided to detect and correct inconsistent referencing in curved artwork regions of circuit designs utilizing mesh reference planes. The invention looks at the design artwork and a script-based processing tool of the preferred embodiment compares the relative positions of signal lines to each edge of the mesh reference plane box, within a user-defined curved artwork area or defined length. If the relative positions of several neighboring signal lines differ outside of a user-defined range, then the tool outputs the required wire position move to improve referencing consistency and reduce characteristic impedance discontinuities.

This invention states that physical design wiring and plane data is used as inputs to an Automated Reference Orientation Checking (AROC) program in order to locate and correct inconsistent referencing in curved artwork applications utilizing mesh reference planes. The AROC program or tool compares the ratios of area on either side of a signal line, within the mesh reference plane cells, or hole, as shown in the figure below. The AROC tool then compares ratios from one signal line to another, within a given range of curved artwork that is user-defined. If the ratios differ outside of a user-defined limit, then correction values, in the form of wiring coordinate changes, are calculated. These corrections are directed into the physical design program so that impedance discontinuities are reduced in the curved artwork region of a high-speed flexible circuit application.

Figure 1A:
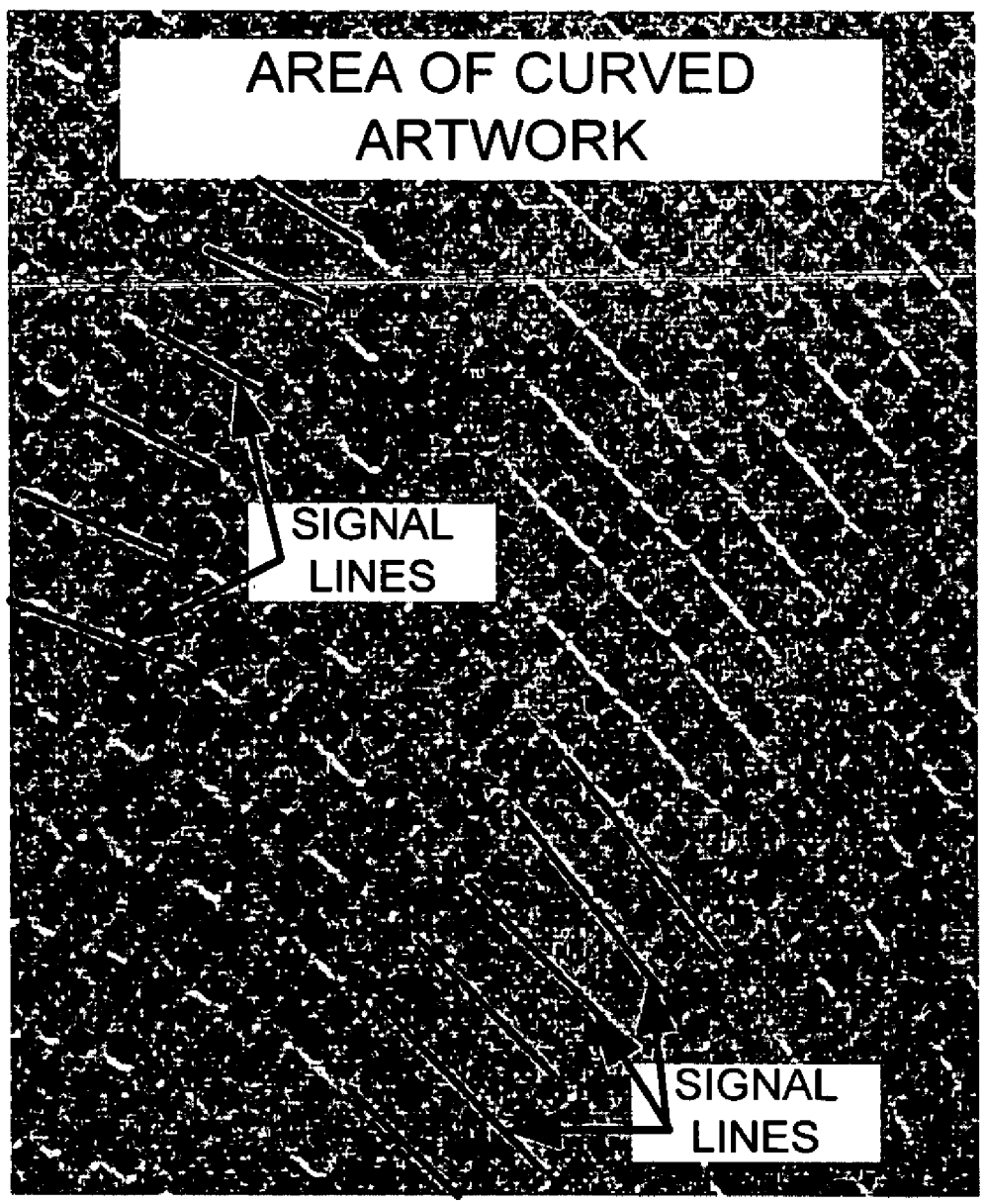
FIGS. 1A and 1B respectively illustrate X-ray data of an area and an enlarged detail of curved artwork in prior art flexible circuit.
Figure 1B:
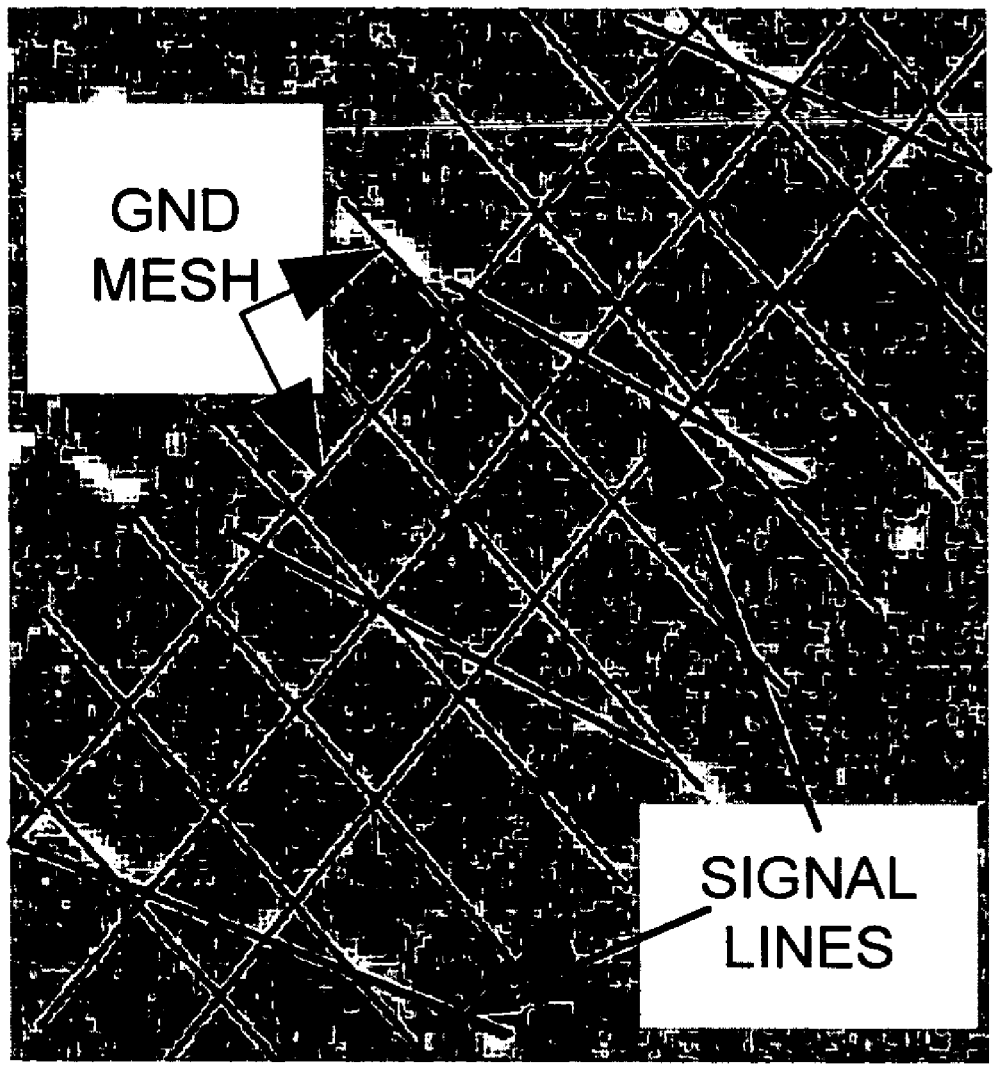
Figure 2:
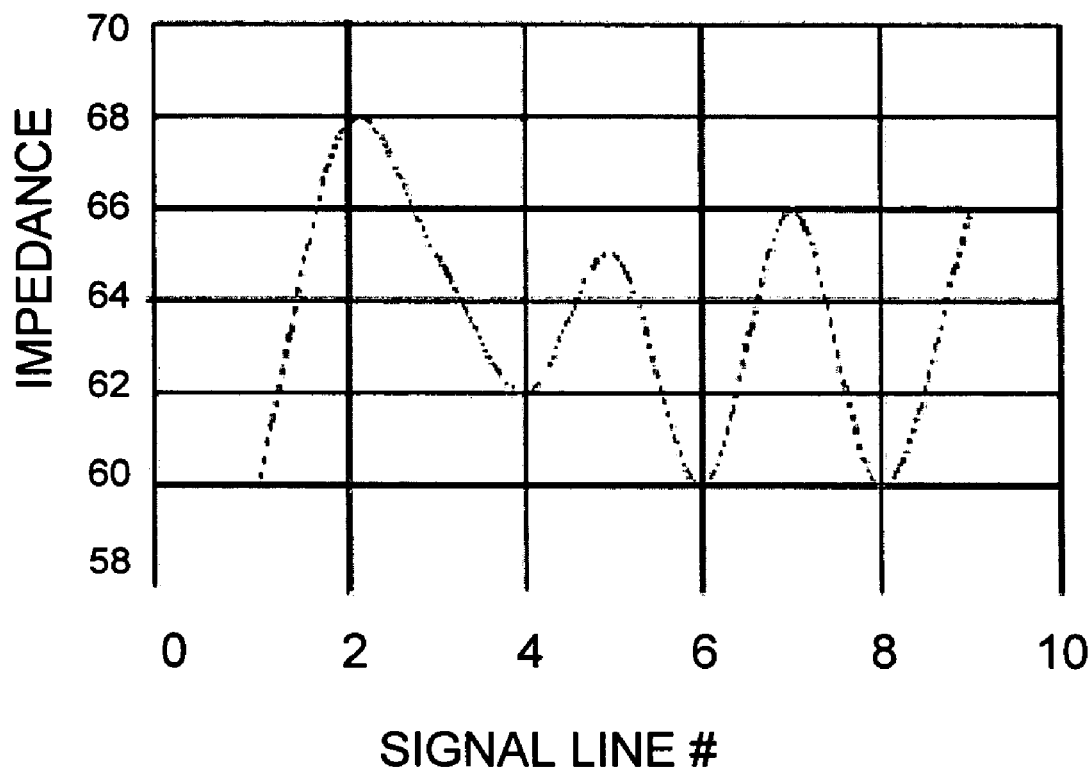
FIG. 2 illustrates prior art characteristic impedance variations with respect to multiple signal lines with the curved artwork in prior art flexible circuit of FIGS. 1A and 1B.
Figure 3A:
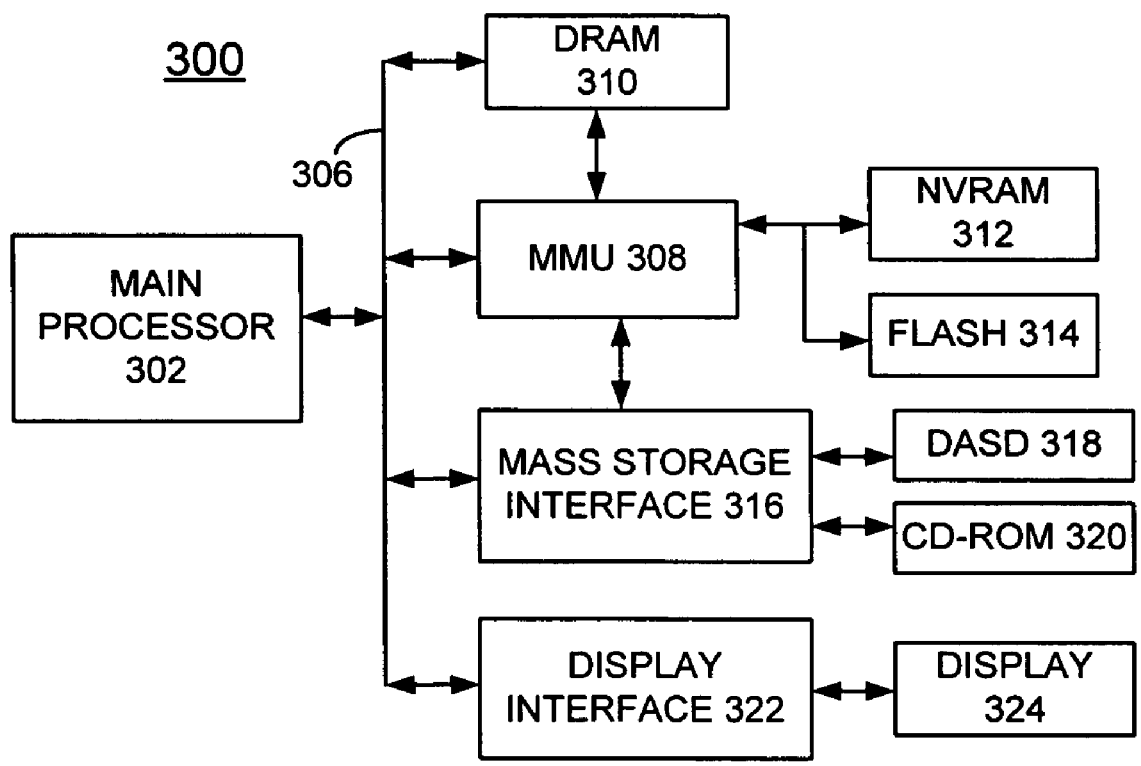
FIGS. 3A and 3B are block diagram representations illustrating a computer system and operating system for implementing characteristic impedance discontinuity reduction in customized high-speed flexible circuit applications in accordance with the preferred embodiment.
Figure 3B:
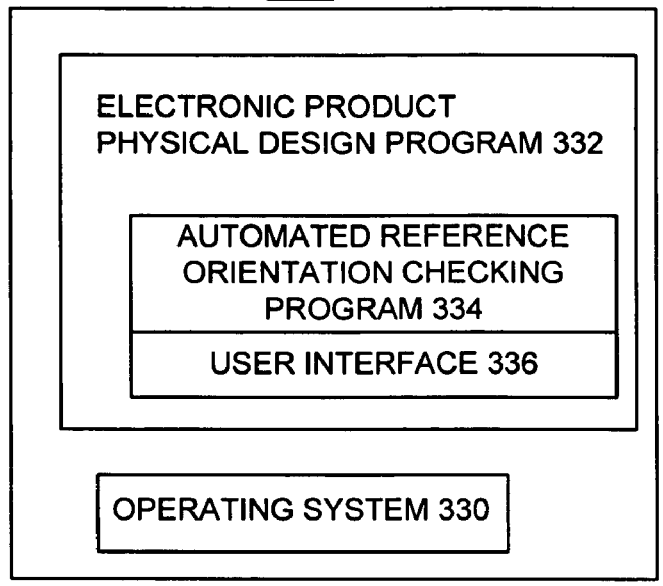

Referring now to the drawings, in FIGS. 3A and 3B there is shown a computer system generally designated by the reference character 300 for implementing methods for reducing characteristic impedance discontinuity in customized high-speed flexible circuit applications in accordance with the preferred embodiment. Computer system 300 includes a main processor 302 or central processor unit (CPU) 302 coupled by a system bus 306 to a memory management unit (MMU) 308 and system memory including a dynamic random access memory (DRAM) 310, a nonvolatile random access memory (NVRAM) 312, and a flash memory 314. A mass storage interface 316 coupled to the system bus 306 and MMU 308 connects a direct access storage device (DASD) 318 and a CD-ROM drive 320 to the main processor 302. Computer system 300 includes a display interface 322 coupled to the system bus 306 and connected to a display 324.

Computer system 300 is shown in simplified form sufficient for understanding the present invention. The illustrated computer system 300 is not intended to imply architectural or functional limitations. The present invention can be used with various hardware implementations and systems and various other internal hardware devices, for example, multiple main processors.

As shown in FIG. 3B, computer system 300 includes an operating system 330, an electronic product physical design program 332, an automated reference orientation checking program 334 of the preferred embodiment, and a user interface 336.

Various commercially available computers can be used for computer system 300, for example, an IBM personal computer. CPU 302 is suitably programmed by the automated reference orientation checking program 334 to execute the flowchart of FIG. 5 for implementing methods for reducing characteristic impedance discontinuity in customized high-speed flexible circuit applications in accordance with the preferred embodiment.

Figure 4:
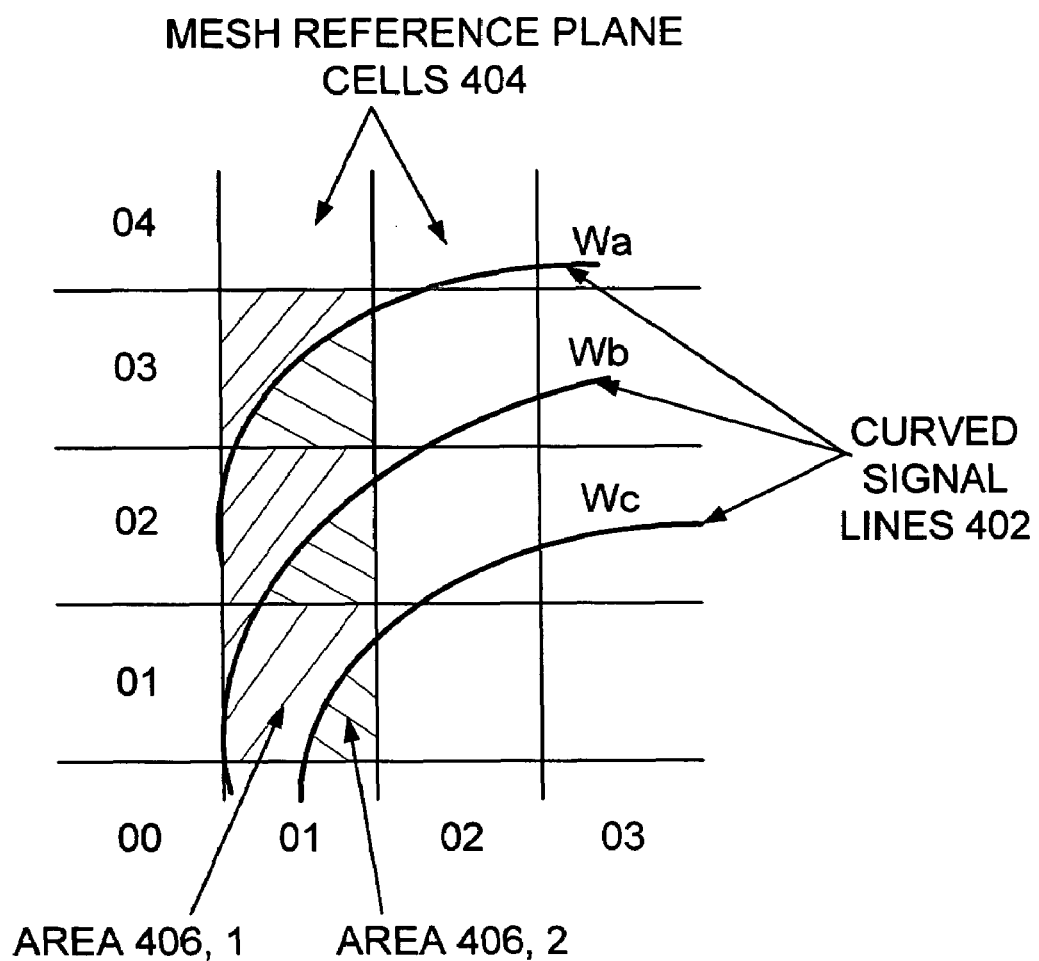
FIG. 4 illustrates an exemplary curved artwork region including a plurality of curved signal lines for implementing characteristic impedance discontinuity reduction in customized high-speed flexible circuit applications in accordance with the preferred embodiment.

Referring now to FIG. 4, there is shown an exemplary curved artwork region generally designated by the reference character 400 for implementing characteristic impedance discontinuity reduction in customized high-speed flexible circuit applications in accordance with the preferred embodiment. Curved artwork region 400 includes a plurality of curved signal lines 402 respectively labeled Wa, Wb, and Wc. The multiple curved signal lines 402 Wa, Wb, and Wc are contained within a plurality of mesh reference plane cells 404. As shown, a respective area 406, 1 and 406, 2 on opposite sides of a signal wire Wc within cell 404 is determined.

In accordance with features of the preferred embodiments, the identified areas 406, 1 and 406, 2 are compared using a user defined delta value. If the compared areas differ greater than the user defined delta value, then a coordinate change for the signal wires 402 Wa, Wb, and Wc is computed for moving the signal wires to reduce characteristic impedance discontinuity.

Figure 5:
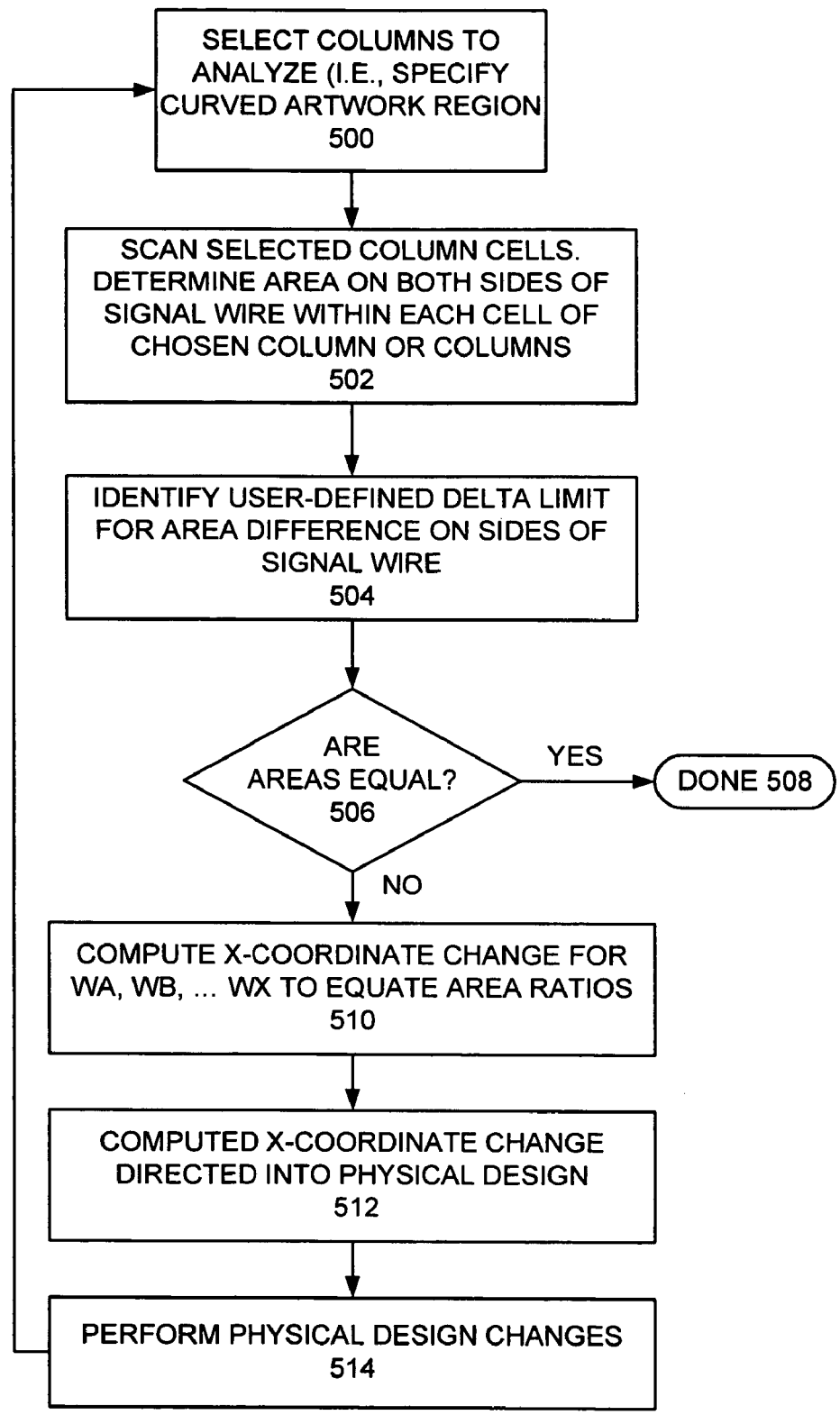
FIG. 5 is a flow chart illustrating exemplary sequential steps for implementing characteristic impedance discontinuity reduction in customized high-speed flexible circuit applications in accordance with the preferred embodiment.

Referring now to FIG. 5, there are shown exemplary sequential steps for implementing characteristic impedance discontinuity reduction in customized high-speed flexible circuit applications in accordance with the preferred embodiment. First a curved artwork region is specified with one or more columns to analyze selected as indicated in a block 500, such as a column of cells 404 as shown in FIG. 4. Selected column cells are scanned and an area on both sides of the signal line 402 within each cell 404 of the chosen column or columns is determined as indicated in a block 502. A user defined input of a difference or delta limit is identified as indicated in a block 504. The identified areas on both sides of the signal line within each cell 404, such as areas 406, 1 and 406, 2 of FIG. 4, are compared using the user defined delta value as indicated in a decision block 506. If the compared areas do not differ greater than the user defined delta value, then the sequential steps are completed as indicated in a block 508.

As indicated in a block 510, if the compared areas differ greater than the user defined delta value, then an X-coordinate change for the signal wires 402, Wa, Wb, through Wx is computed for moving the signal wires to equate the area ratios and thereby reduce characteristic impedance discontinuity. Then the computed X-coordinate change for the signal wires 402, Wa, Wb, through Wx is directed into the physical design as indicated in a block 512 and the physical design changes are performed as indicated in a block 514. Then the sequential steps return to block 500 to repeat the automated steps for implementing characteristic impedance discontinuity reduction in customized high-speed flexible circuit applications in accordance with the preferred embodiment.

Figure 6:
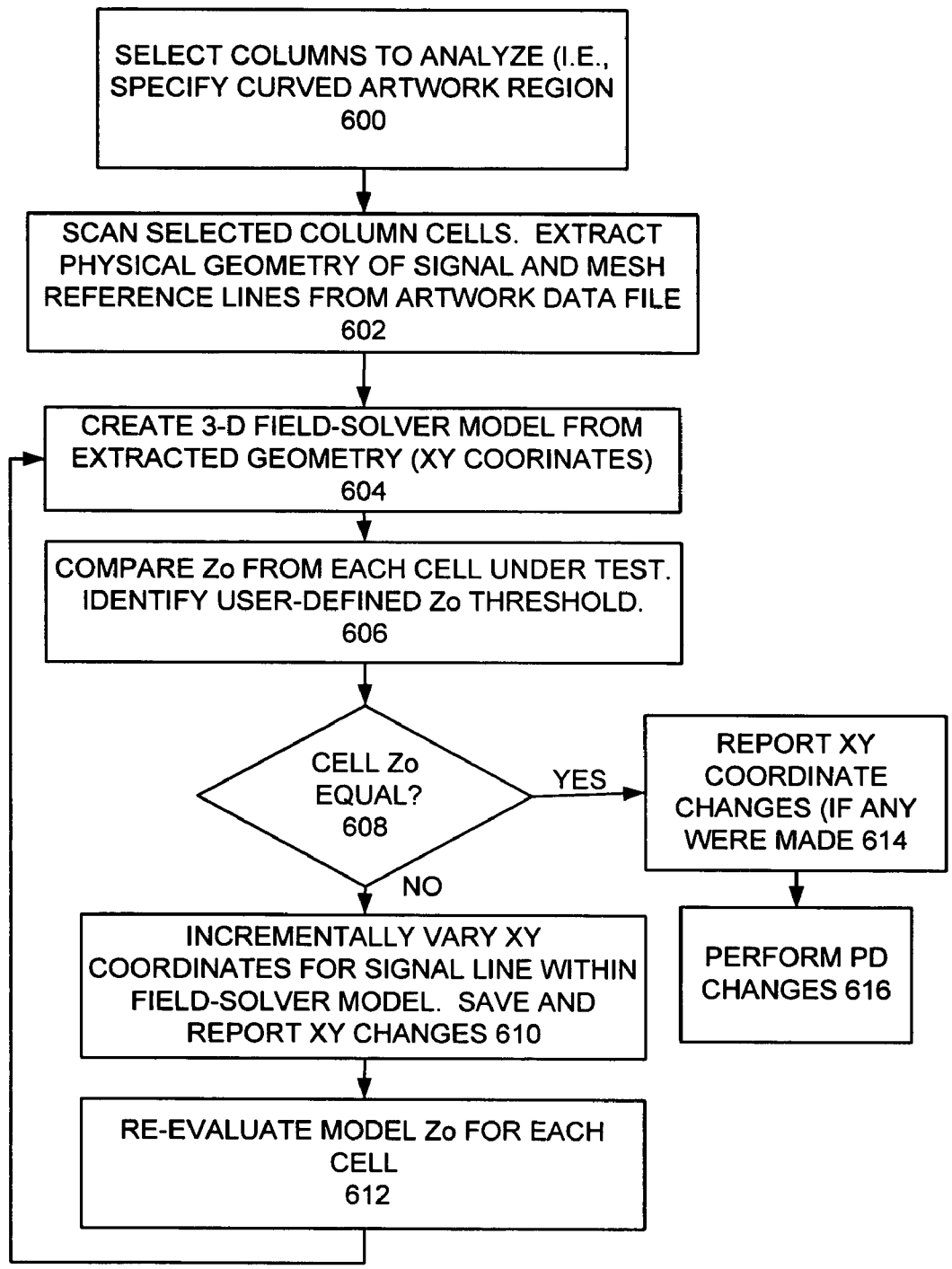
FIG. 6 is a flow chart illustrating alternative exemplary sequential steps for implementing characteristic impedance discontinuity reduction in customized high-speed flexible circuit applications in accordance with another preferred embodiment.

In accordance with feature of the preferred embodiments, an alternative method for implementing characteristic impedance discontinuity reduction in customized high-speed flexible circuit applications of another preferred embodiment is illustrated and described with respect to FIG. 6. The alternative automated tool's algorithm shall use xy(coordinates) and z(thickness) data extracted (postpd) from both the signal line and the mesh reference copper within each cell, as defined by the user. The tool uses this data to create input files for a 3D field-solver. The field-solver generates simulation models based on the extracted geometrical artwork data and calculates the characteristic impedance of the signal line segment within each cell.

In brief, electrical models are generated for each transmission line segment within the cells specified by the user. The tool accomplishes this by combining user-defined dielectric constant, dielectric thickness and dissipation factor data with the tool-extracted postpd signal line and ground mesh physical dimensions. These electrical and physical geometry data points are used to automatically create the 3-D model input files, which are fed to the field-solver. Once the characteristic impedance data is returned for each cell, the disclosed tool compares impedance values between cells or to that of a user-defined nominal set-point. Next, the tool flags cells that are outside the specified user input limit and further modeling is performed. The additional modeling is performed by the field-solver by varying previous cell geometrical dimensions resulting in suggested artwork modifications that reduce Zo variations between cells and/or with respect to the user-defined nominal set-point.

In accordance with feature of the preferred embodiments, this alternative method can compare achieved mesh reference impedance with that of mating card and module impedances such that the method of the preferred embodiment can play a role in overall system design methodology.

Referring now to FIG. 6, there are shown alternative exemplary sequential steps for implementing characteristic impedance discontinuity reduction in customized high-speed flexible circuit applications in accordance with the preferred embodiment. First a curved artwork region is specified with one or more columns to analyze selected as indicated in a block 600, such as a column of cells 404 as shown in FIG. 4. Selected column cells are scanned and physical geometry of signal and mesh reference lines are extracted from an artwork data file as indicated in a block 602. A three-dimensional (3-D) field-solver mode is created from extracted geometry (xy coordinates) and input thickness, Er, tand, as indicated in a block 604. Then a characteristic impedance Zo of the signal line segment within each cell is calculated and compared to a user defined nominal set-point Zo threshold as indicated in a block 606. It is determined whether the compared cell Zo values are equal as indicated in a decision block 608. When the compared cell Zo values are not equal, then the xy coordinates are incrementally varied for the signal line within the field-solver model and the xy changes are saved and reported as indicated in a block 610. The model Zo is re-evaluated for each cell as indicated in a block 612. Then the sequential steps return to block 604 to repeat the automated steps for implementing characteristic impedance discontinuity reduction in customized high-speed flexible circuit applications in accordance with the preferred embodiment. When the compared cell Zo values are equal, then the xy coordinate changes are reported, if any were made as indicated in a block 614. Then the physical design changes are performed as indicated in a block 616.

Figure 7:
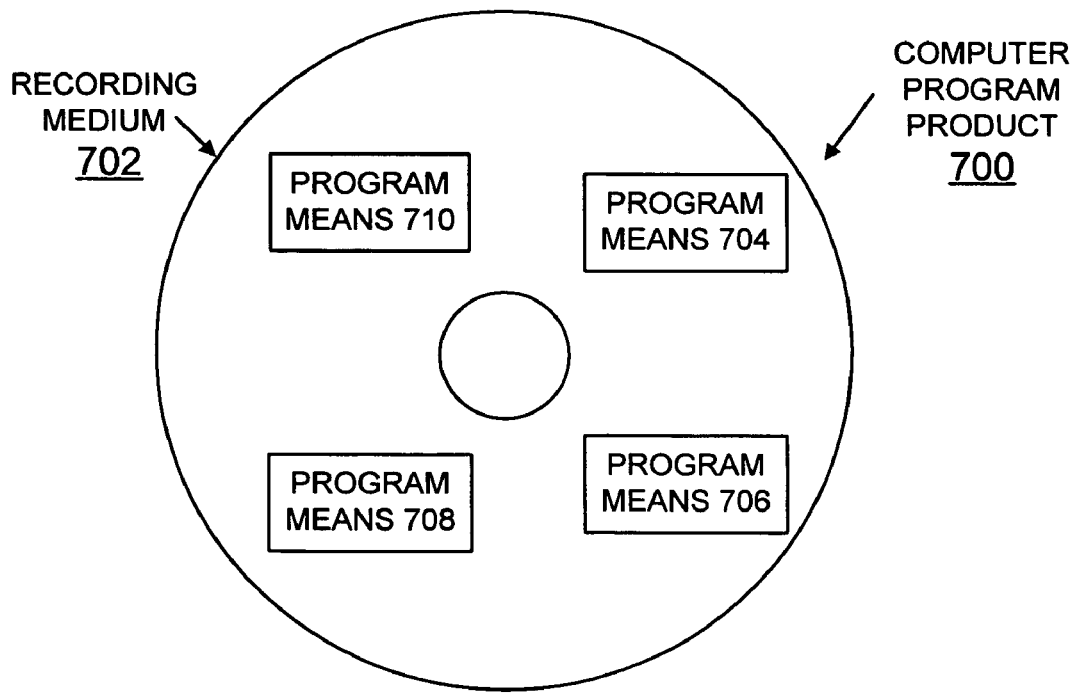
FIG. 7 is a block diagram illustrating a computer program product in accordance with the preferred embodiment.

Referring now to FIG. 7, an article of manufacture or a computer program product 700 of the invention is illustrated. The computer program product 700 includes a recording medium 702, such as, a floppy disk, a high capacity read only memory in the form of an optically read compact disk or CD-ROM, a tape, a transmission type media such as a digital or analog communications link, or a similar computer program product. Recording medium 702 stores program means 704, 706, 708, 710 on the medium 702 for carrying out methods for implementing customized high-speed flexible circuit applications with characteristic impedance discontinuity reduction of the preferred embodiment in the system 300 of FIGS. 3A and 3B.

A sequence of program instructions or a logical assembly of one or more interrelated modules defined by the recorded program means 704, 706, 708, 710, direct the computer system 300 for implementing characteristic impedance discontinuity reduction in customized high-speed flexible circuit applications of the preferred embodiment.

While the present invention has been described with reference to the details of the embodiments of the invention shown in the drawing, these details are not intended to limit the scope of the invention as claimed in the appended claims.

What is claimed is:

1. A method for implementing characteristic impedance discontinuity reduction in customized high-speed flexible circuit applications comprising the steps of:
    selecting a curved artwork region;
    scanning selected cells within the curved artwork region and determining an area on opposite sides of a signal wire within each cell;
    comparing identified areas using a user defined delta value; and
    responsive to a difference of said compared areas being greater than the user defined delta value, computing a coordinate change for the signal wire for moving the signal wire to reduce characteristic impedance discontinuity.

2. A method for implementing characteristic impedance discontinuity reduction as recited in claim 1 includes the steps of performing physical design changes using said computed coordinate change for the signal wire.

3. A method for implementing characteristic impedance discontinuity reduction as recited in claim 2 includes the steps of repeating the selecting, scanning and comparing steps after performing the physical design changes.

4. A method for implementing characteristic impedance discontinuity reduction as recited in claim 1 wherein the step of selecting a curved artwork region includes the steps of identifying a region with signal wiring having a wiring radii.

5. A method for implementing characteristic impedance discontinuity reduction as recited in claim 1 includes the steps of performing physical design changes using said computed coordinate change for a plurality of adjacent signal wires.

6. A method for implementing characteristic impedance discontinuity reduction in customized high-speed flexible circuit applications comprising the steps of:
    selecting a curved artwork region;
    scanning selected cells within the curved artwork region and determining a physical geometry of a signal wire and mesh reference lines within each cell;
    calculating a characteristic impedance value for said selected cells;
    comparing said characteristic impedance value for said cells using a user defined threshold value; and
    responsive to a difference of said compared values being greater than the user defined threshold value, computing a coordinate change for the signal wire for moving the signal wire to reduce characteristic impedance discontinuity.

* * * * *